United States Patent [19]
Chang

[11] Patent Number: 6,153,906
[45] Date of Patent: Nov. 28, 2000

[54] FLASH MEMORY

[75] Inventor: Kuang-Yeh Chang, Taipei, Taiwan

[73] Assignee: United Microelectronics Corp., Hsinchu, Taiwan

[21] Appl. No.: 09/207,113

[22] Filed: Dec. 8, 1998

[51] Int. Cl.[7] .................................................. H01L 29/72

[52] U.S. Cl. .......................... 257/321; 257/319; 257/324; 257/331

[58] Field of Search ................................... 257/321, 319, 257/324, 331

[56] References Cited

U.S. PATENT DOCUMENTS 6,043,530  6/2000  Chang ....................................... 257/321
6,075,267  6/2000  Taji et al. ................................ 257/321

Primary Examiner—Edward Wojciechowicz
Attorney, Agent, or Firm—Oblon, Spivak, McClelland, Maier & Neustadt, P.C.

[57] ABSTRACT

A flash memory. An oxide layer is on a substrate. A stacked gate is formed on the substrate. A tunnel diffusion region is formed in the substrate next to a first side of the stacked gate. The tunnel diffusion region extends to a portion of the substrate under the stacked gate. A doped region is formed in the substrate next to a second side of the stacked gate. The doped region is distant away from the stacked gate by a lateral distance. An inter-poly dielectric layer covers the tunnel diffusion region the doped region, and the stacked gate. A polysilicon layer is on the inter-poly dielectric layer and extends perpendicular to the stacked gate.

11 Claims, 6 Drawing Sheets

FLASH MEMORY

BACKGROUND OF THE INVENTION

1. Field of the Invention

The invention relates to a memory device, and more particularly, to a flash memory device.

2. Description of the Related Art

Electrically erasable and programmable read only memory (EEPROM) is currently one the most widely used memory devices applied in personal computers and electronic equipment. A memory cell in a early developed conventional EEPROM comprises a transistor with a floating gate to achieve the operations of writing, erasing, and storing data while electrical shut down. This conventional memory cell typically occupies a large surface area. The data access speed is between 150 ns to 200 ns. A lately developed memory cell has a faster data access speed ranged between 70 ns to 80 ns. This memory cell is named as a flash memory by Intel Co.

In a transistor of a conventional flash memory, the hot electron effect is applied for data storing, and the Fowler-Nordheim tunneling effect is applied for data erasure. While storing data, a high voltage of 8V is applied between the drain region and the source region. The controlling gate is biased with the same high voltage at the same time. The hot electrons may thus flow out of the source region. While approaching the drain region, these hot electrons tunnel through the oxide layer and are trapped in the floating gate. This is the so-called drain side injection operation. The threshold of the floating gate is enhanced, and the object of storing data is achieved. By applying a positive voltage to the source region and a negative voltage to the controlling gate, the electrons trapped in the floating gate flow out of the floating gate and tunnel through the oxide layer, and thus, the stored data are erased. The floating gate is retrieved to the status before data storing.

FIG. 1 shows a layout of a conventional flash memory. FIGS. 2, 3, 4 are cross sectional views taken along a cutting line I—I in FIG. 1, and FIGS. 5 and 6 are cross sectional views taken along the cutting line II—II in FIG. 1. The cross sectional views of FIG. 3 to FIG. 6 show a conventional process for fabricating a flash memory.

Referring to both FIG. 2 and FIG. 5, a substrate 10 is provided. A pad oxide layer (not shown) is formed on the substrate 10. Using local oxidation, a field oxide layer 14 is formed to define an active region of the substrate 10. Using wet etching, the pad oxide layer is removed. Using thermal oxidation, a tunnel oxide layer 12 with a thickness of 100 Å is formed on the substrate 10. A polysilicon layer having a thickness of 1500 Å is formed on the tunnel oxide layer 12. Using photolithography and etching process, the polysilicon layer is patterned and then denoted by a reference numeral 16 in the figures.

An inter-poly dielectric layer with a thickness of 250 Å is formed to cover the polysilicon layer 16. Another polysilicon layer with a thickness of 3000 Å is formed. Using photolithography and etching process, the polysilicon layer is patterned and denoted by a reference numeral 20 as shown in the figure. Using, the polysilicon layer as a mask, a etching process is performed on the polysilicon layer 16 until the substrate 10 is exposed. Thus, a gate of a flash memory is formed by the polysilicon layer 20, the inter-poly dielectric layer 18, the polysilicon layer 16, and the tunnel oxide layer 12.

A photo-resist layer 21 is formed to cover a part of the substrate 10, while the exposed part of the substrate 10 includes the substrate 10 at a side of the gate. By performing heavy phosphorus ion implantation with a tile angle, the exposed substrate 10 is doped. An annealing process is performed to form a tunnel diffusion region 24. The tunnel diffusion region 24 extends toward a region under the gate.

In FIG. 3, the photo-resist layer 21 is removed. Using the polysilicon layer 21 as a mask, a heavy arsenic ion implantation is performed on the substrate 10 to form a source region 22a and a drain region 22b. The source region 22a is encompassed by the tunnel diffusion region 24.

Referring to both FIG. 4 and FIG. 6, a dielectric layer 30 is formed to cover the substrate 10. Using photolithography and etching, a contact window 32 is formed to penetrate through the dielectric layer 30 and to expose the drain region 22b. A metal layer 34 is formed to fill the contact window 32, so as to couple with the drain region 22b. The metal layer 34 is used as a bit line.

In the above conventional flash memory, the programming step is operated by hot electrons injected from aside of the drain region. Therefore, a high voltage (8V) is require to provide a high current. An over-erase effect thus often occurs.

In addition, the dimension of the flash memory is restricted by the size of the contact window 32. This flash memory can thus only be shrunk to a certain extend in size. With the formation of the field oxide, the shrinkage is further limited. The low level of planarization is also another drawback for using the field oxide layer. Moreover, the contact window is filled with a metal layer as a bit line, the interference by the reflection from the metal layer is inevitable.

SUMMARY OF THE INVENTION

It is therefore an object of the invention to provide a flash memory. The flash memory adapts the mechanism of source side injection, so that a programming current of about $10^2$ to $10^3$ smaller than the conventional drain side injection type flash memory is required. Since the operating current is greatly reduced, the flash memory can be applied for low voltage and low power devices. The flash memory comprises a self-aligned source side injection gate, and thus, a small cell size is achieved. In addition, the flash memory has a flat cell structure with good planarity.

To achieve these objects and advantages, and in accordance with the purpose of the invention, as embodied and broadly described herein, the invention is directed towards a flash memory. An oxide layer is on a substrate. A first polysilicon layer is on the oxide layer, a first inter-poly dielectric layer is on the first polysilicon layer, and a second polysilicon layer covers the first iner-poly dielectric layer and extending as a polysilicon strip on the substrate. The first polysilicon layer, the first inter-poly dielectric layer, and the second polysilicon layer form a stacked gate on the substrate. A tunnel diffusion region is formed in the substrate next to a first side of the first polysilicon layer. The tunnel diffusion region extends to a portion of the substrate under the gate. A doped region is formed in the substrate next to a second side of the first polysilicon layer. The doped region is distant away from the first polysilicon layer by a lateral distance. A second inter-poly dielectric layer covers the tunnel diffusion region, the doped region, and the second polysilicon layer. A third polysilicon layer is on the second inter-poly dielectric layer and extends perpendicular to the second polysilicon layer. The third polysilicon layer is used as a select gate.

The invention adapts a source side injection method, so that a high programming, efficient and a low write current of about 100 to 1000 μA are obtained. Thus, the flash memory can be applied to a low voltage and low power operation. In addition, the source and drain regions are formed in different ion implantation processes so that characteristics of the flash memory can be adjusted as specifically required.

The formation of the select gate prevents the over erasing effect caused by abnormal current leakage to maintain a normal operation of the flash memory.

The doped region can be used as a buried line. Therefore, neither a contact window nor a metal layer to fill the contact window is required. The interference caused by reflection from the metal layer is thus avoided.

Without the formation of the field oxide layer, a good planarity is achieved. The memory can be designed with a much smaller size.

It is to be understood that both the foregoing general description and the following detailed description are exemplary and explanatory only and are not restrictive of the invention, as claimed.

DESCRIPTION OF THE PREFERRED EMBODIMENTS

Figure 1:
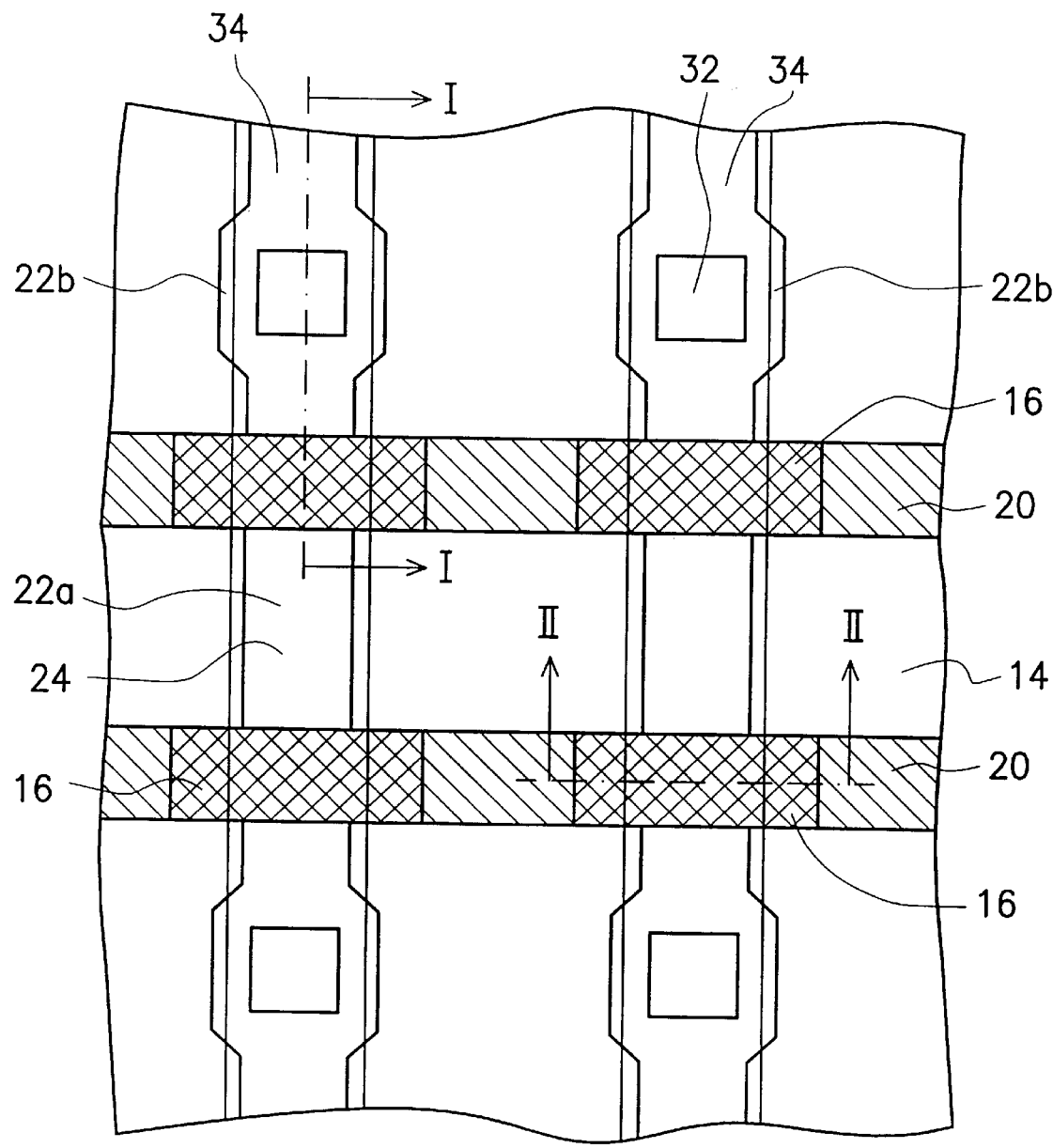
FIG. 1 shows a layout of a conventional flash memory.
Figure 2:
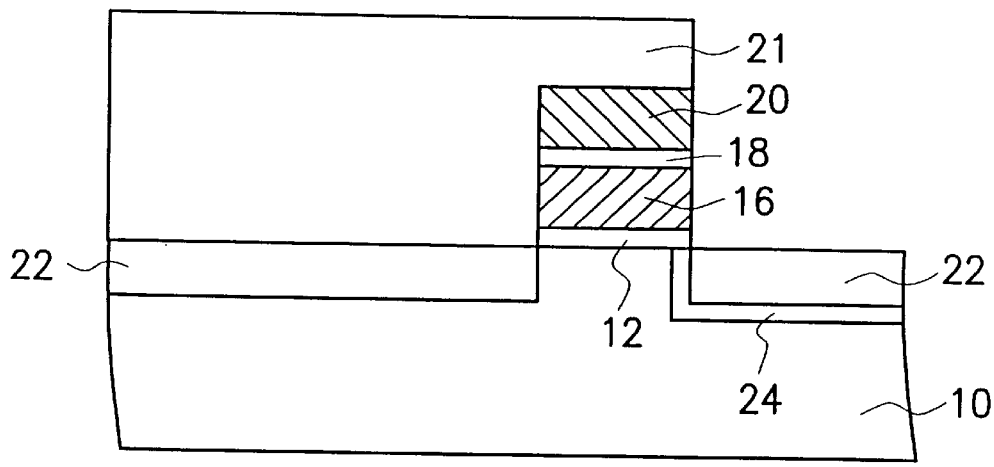
FIG. 2 to FIG. 4 are cross sectional views taken along the cutting line I—I in FIG. 1, showing a conventional fabrication process of the memory shown in FIG. 1.
Figure 3:
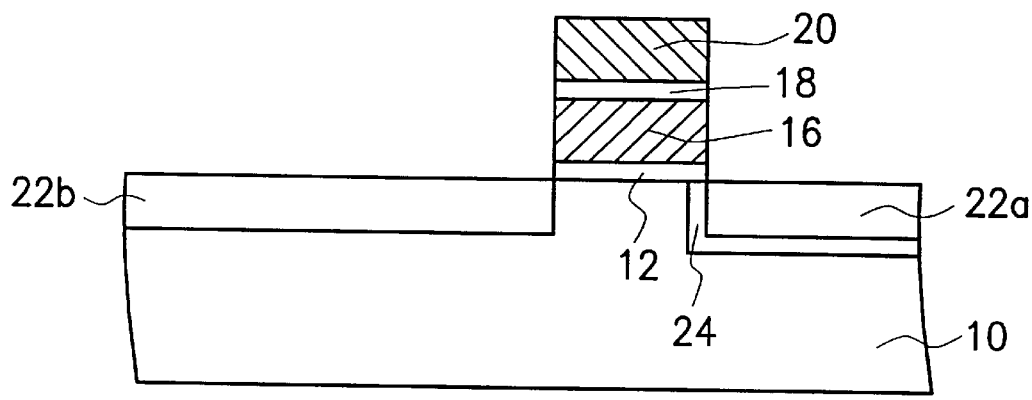
Figure 4:
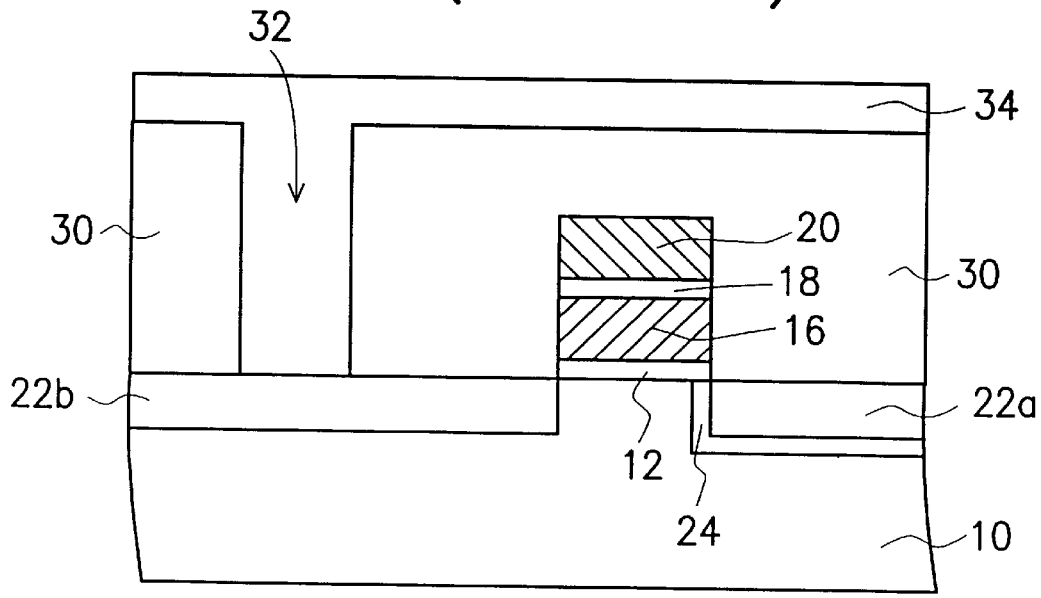
Figure 5:
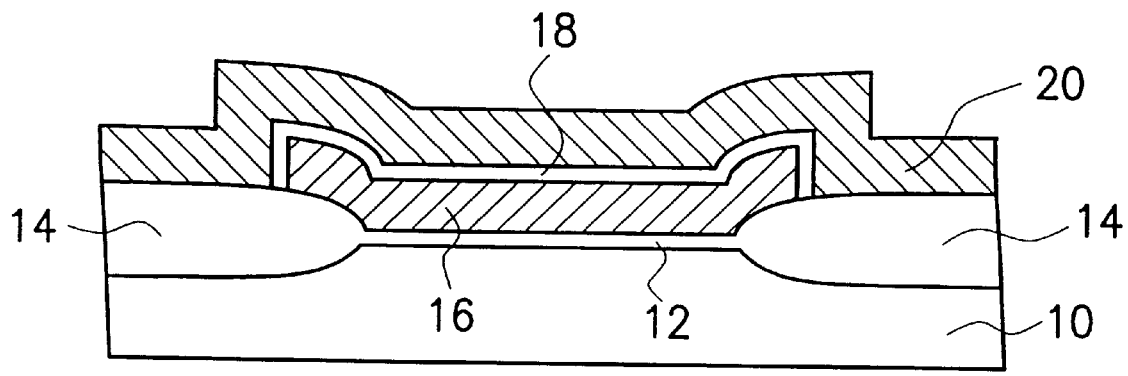
FIG. 5 and FIG. 6 are cross section views taken along the cutting line II—II in FIG. 1.
Figure 6:
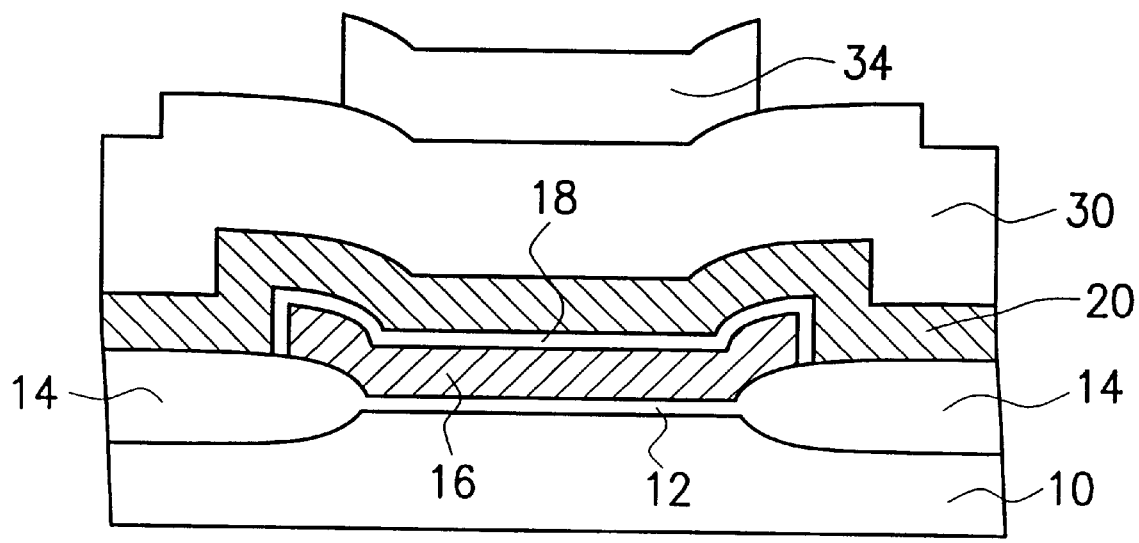
Figure 7:
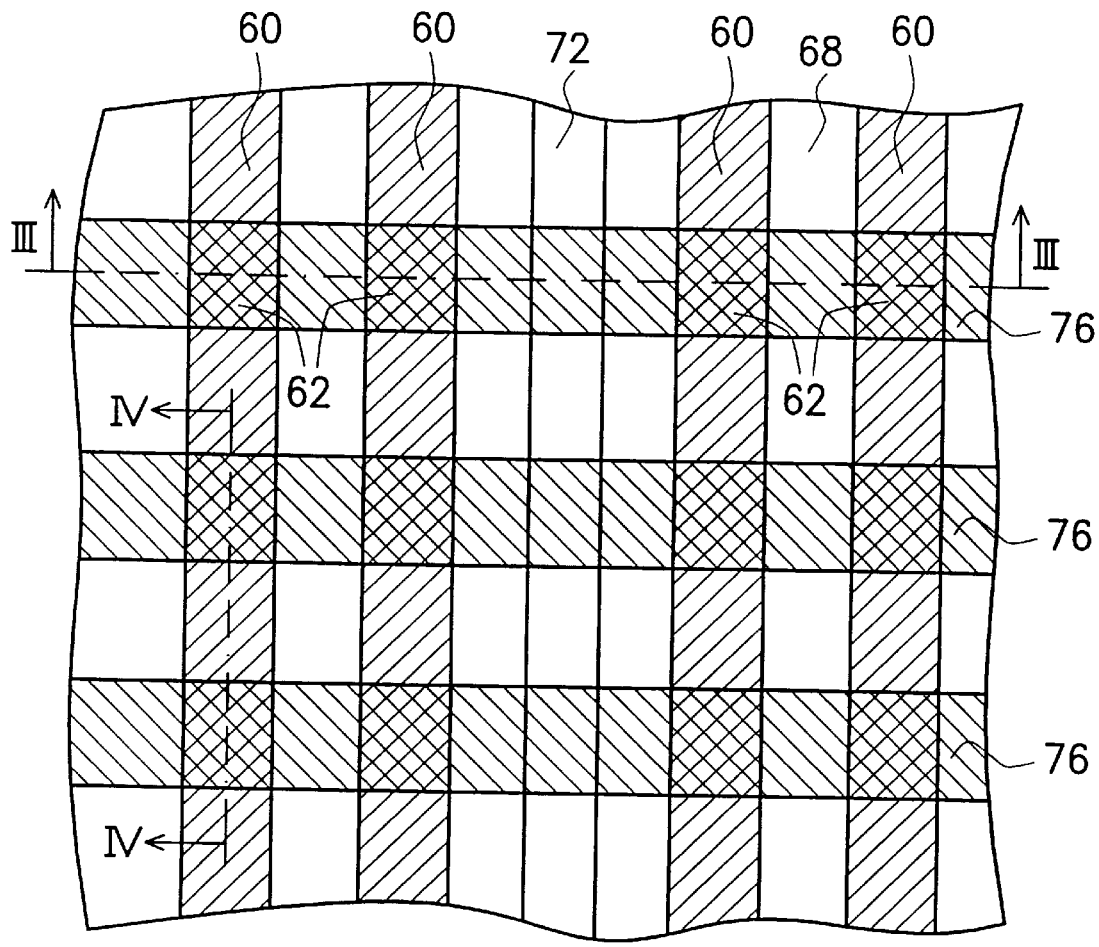
FIG. 7 shows a layout of a flash memory of a preferred embodiment according to the invention.

FIG. 7 shows a layout of a flash memory of a preferred embodiment according to the invention. FIG. 8 to FIG. 12 are cross sectional views showing the fabrication process of the flash memory shown in FIG. 7. The cross sectional views of FIG. 8 to FIG. 11 are taken along the cutting line Ill—III in FIG. 7, and the cross section view of FIG. 12 is taken along IV—IV in FIG. 7.

Figure 8:
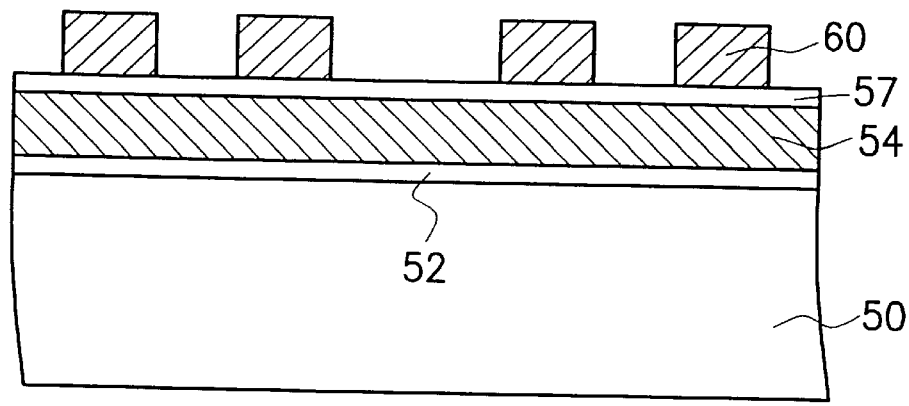
FIG. 8 to FIG. 12 are cross sectional views taken along the cutting line III—III in FIG. 7, showing the fabrication process of the flash memory shown in FIG. 7.

In FIG. 8, a semiconductor substrate 50 is provided. An oxide layer 52 with a thickness of about 85 Å to 100 Å is formed, for example, by thermal oxidation, on the substrate 50. A polysilicon layer 54 is formed on the oxide layer 52. The polysilicon layer 54 preferably having a thickness of about 3000 Å is formed by chemical vapor deposition (CVD), for example, low pressure CVD (LPCVD). Using photolithography and etching, the polysilicon layer 54 and the oxide layer 52 are patterned to expose the substrate 50 astride of the patterned polysilicon layer 54. Being patterned, the oxide layer 52 is used as a tunnel oxide layer.

Using, for example, LPCVD, an inter-poly dielectric layer 57 is formed to cover the polysilicon layer 54. The inter-poly dielectric layer 57 includes, for example, a stacked layer comprising oxide/nitride/oxide with a thickness of about 250 Å. On the inter-poly dielectric layer 57, a polysilicon layer with a thickness of about 3000 Å is formed CVD, for example, by LPCVD.

The polysilicon layer is then defined to be used as a controlling gate. The patterned polysilicon layer is preferably in a strip shape on the substrate 50 and is denoted by a reference numeral 60.

Figure 9:
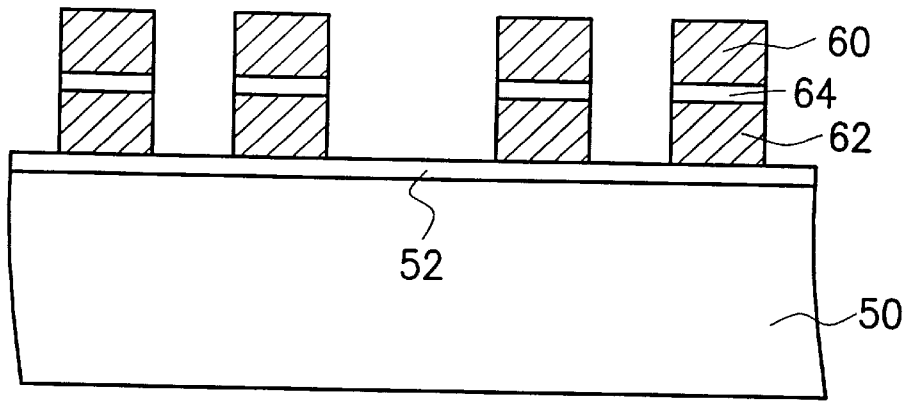

In FIG. 9, using the polysilicon layer 60 as a mask, the exposed inter-poly dielectric layer 57 and the underlying polysilicon layer 54 are removed. The polysilicon layer 60 is used as a controlling gate, while the remaining polysilicon layer 62 is used as a floating gate. Whereas, the controlling gate 60 and the floating gate 62 are isolated by the remaining inter-poly dielectric layer 64. A stacked gate comprising the controlling gate 60, the inter-poly dielectric layer 64, and the floating gate 62 is thus formed. Typically, after removing the exposed inter-poly dielectric layer 57 and the underlying polysilicon layer 54, the remaining inter-poly dielectric layer 64 and the floating gate 62 are in an island shape. However, it is noted that the topography of the floating gate 62, the inter-poly dielectric layer 64, and the controlling gate 60 depends on the specific requirement.

Figure 10:
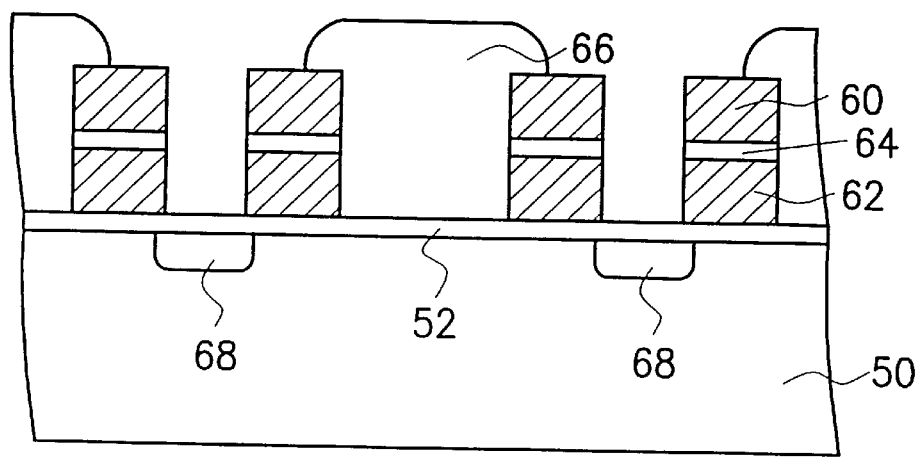

In FIG. 10, a photo-resist layer 66 is formed to cover a portion of the polysilicon layer 60. The tunnel oxide layer 52 is selectively exposed. As shown in the figure, the tunnel oxide layer 52 next one side of the polysilicon layer 60 is exposed, while the tunnel oxide layer 52 next the opposite side of the polysilicon layer 60 is covered by the photo-resist layer 66. An ion implantation is performed on the substrate 50 underlying the exposed tunnel oxide layer 52. The ion implantation is performed with heavy N-type ions, such as phosphorus ions, while a P-type substrate is in use. The ions are implanted with a tilt angle into the substrate 50. An annealing process is performed to form a tunnel diffusion region 68. The tunnel diffusion region 68 is thus located under the exposed tunnel oxide layer 52 and extends to a part of the substrate 50 underlying the polysilicon layer 62.

Figure 11:
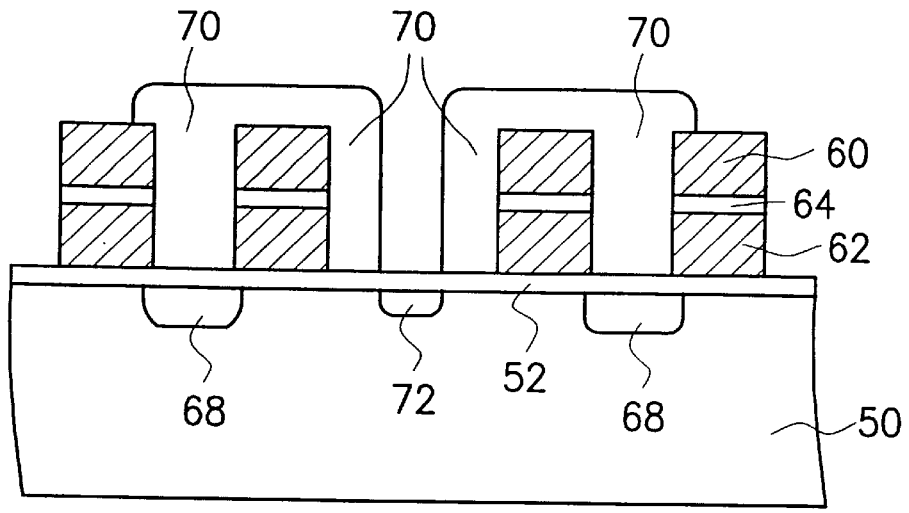
Figure 12:
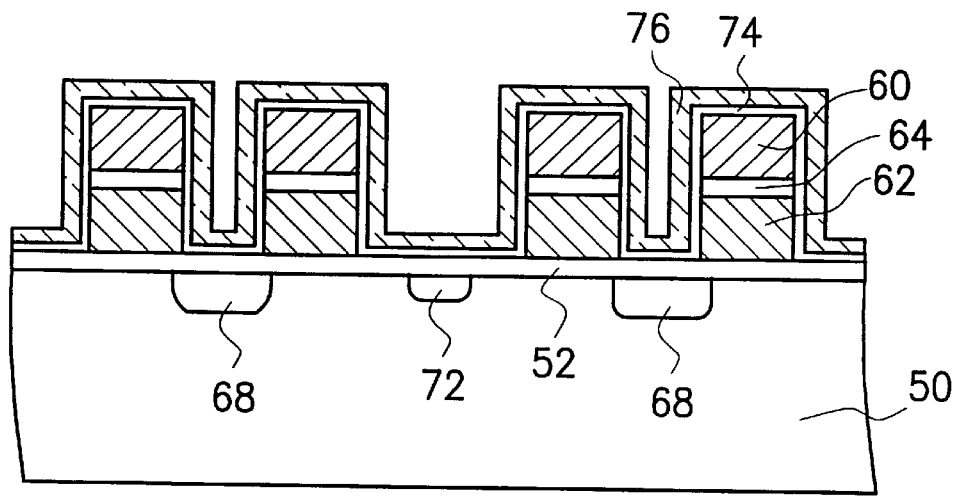

In FIG. 11, the photo-resist layer 66 is removed. Another photo-resist layer 70 is formed to cover the tunnel oxide layer 52 aligned over the tunnel diffusion region 68, the polysilicon layer 60, and a part of the tunnel oxide layer 52 next to the opposite side of the polysilicon layer 60. That is, a part of the tunnel oxide layer 52 is exposed next to the other side of the polysilicon layer 60. A heavily ion implantation is performed on the substrate 50 underlying the exposed tunnel oxide layer 52. N-type ions, for example, arsenic ions, are used while a P-type substrate 50 is selected. An annealing process is performed, so that a doped region 72 is formed. The doped region is used as a source region. The doped region 72 has a lateral distance away from the polysilicon layer 62. In this embodiment, the lateral distance is the thickness of the photo-resist layer 70 covering the tunnel oxide layer 52 next to the opposite side of the polysilicon layer 60.

Figure 13:
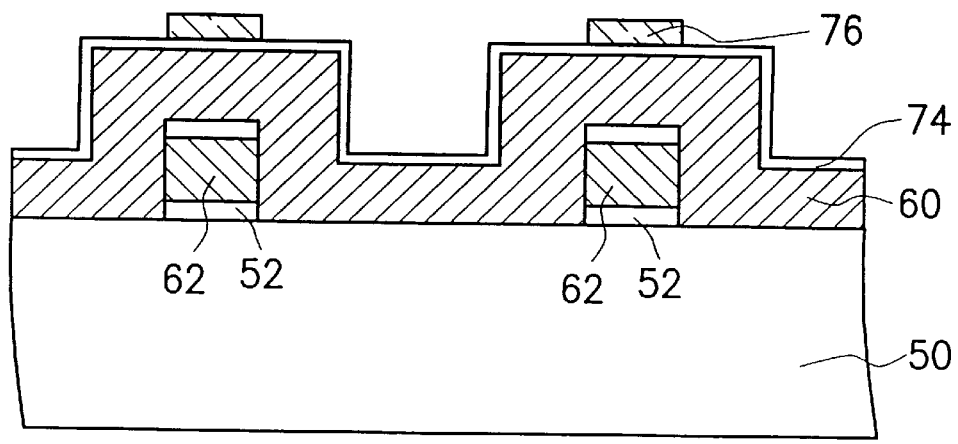
FIG. 13 is a cross sectional view taken along the cutting line IV—IV in FIG. 7.

Referring to both FIG. 12 and FIG. 13, the photo-resist layer 70 is removed. Using, for example, LPCVD, an inter-poly dielectric layer 74 is formed along a surface profile of the substrate 50. The regions to be covered by the inter-poly dielectric layer 74 includes the tunnel diffusion region 68, the doped region 72, the polysilicon layers 60 and 62, and the inter-poly dielectric layer 64. Preferably, the inter-poly dielectric layer 74 is formed by oxide/nitride/oxide with a thickness of about 350 Å. Using, for example, LPCVD, a polysilicon layer is formed on the inter-poly dielectric layer 74. The polysilicon layer is patterned as a select gate 76 to extend towards a direction approximately perpendicular to the polysilicon layer 60. Observing from the top view as shown in FIG. 7, the polysilicon layer 60 and the select gate 76 intersect with each other. Furthermore, the select gate 76 is formed corresponding to the position of the polysilicon layer 62, that is, the floating gate.

In this embodiment. N-type ions are implanted to form the tunnel diffusion region 68 and the heavily doped region 72 while a P-type substrate 50 is provided. It is appreciated that P-type tunnel diffusion region and heavily doped region may also be formed instead of N-type doped region while an N-type substrate is in use. The fabrication method is the same and the device can be formed by interchanging P into N, and N into P.

In the invention, a source side injection method is used to provide a high programming efficient and a low access current, for example, of about 100 to 1000 $\mu$A. Therefore, a high voltage applied in a conventional flash memory is not required for this low voltage and low power operation.

Since the source region and drain region are formed by different doping processes, so that the characteristics of the flash memory can be controlled by adjusting the doping parameters.

The formation of the select gate avoid the over-erase effect caused by abnormal leakage current. Therefore, a normal operation of the flash memory is maintained.

The doped region 72 can also be used as a buried conductive line. A contact window is thus unnecessary. The additional metal layer formed in the conventional method to couple the source region is not required, so that the interference caused by the reflection from the metal layer is not existent.

The flash memory formed in the invention dose not employ the formation of a field oxide layer for isolation, so that a much improved planarity is achieved. Furthermore, without the formation of contact window and field oxide, the size of the memory can be greatly reduced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A flash memory, comprising:

a substrate;

an oxide layer, on the substrate;

a first polysilicon layer on the oxide layer;

a first inter-poly dielectric layer, on the first polysilicon layer;

a second polysilicon layer, covering the first iner-poly dielectric layer and extending as a polysilicon strip on the substrate;

a tunnel diffusion region next to a first side of the first polysilicon layer in the substrate and extending to a portion of the substrate under the first polysilicon laeyr;

a doped region, next to a second side of the first polysilicon layer in the substrate;

a second inter-poly dielectric layer, covering the tunnel diffusion region, the doped region, and the second polysilicon layer; and a third polysilicon layer, on the second inter-poly dielectric layer and extending perpendicular to the second polysilicon layer.

2. The flash memory according to claim 1, wherein the tunnel diffusion region includes a phosphorus diffusion region.

3. The flash memory according to claim 1, wherein the doped region includes an arsenic doped region.

4. The flash memory according to claim 1, wherein the doped region is distant away from the first polysilicon layer by a lateral distance.

5. A flash memory, comprising:

a substrate:

an oxide layer, on the substrate;

a stacked gate, comprising a floating gate on the oxide layer, a first dielectric layer on the floating gate, and a controlling gate covering the first dielectric layer;

a tunnel diffusion region, next to a first side wall of the stacked gate in the substrate and extending towards a part of the substrate under the stacked gate;

a source region, next to a second side wall of the stacked gate in the substrate and having a lateral distance away from the second side wall;

a second dielectric layer, covering the stacked gate, the tunnel diffusion region, and the source region; and a select gate, perpendicular to the control gate on the second dielectric layer.

6. The flash memory according to claim 5, wherein the floating gate comprises a polysilicon layer.

7. The flash memory according to claim 5, wherein the controlling gate comprises a polysilicon layer.

8. The flash memory according to claim 5, wherein the tunnel diffusion region comprises a heavily N-type doped region.

9. The flash memory according to claim 8, wherein the tunnel diffusion region comprises a phosphorus doped region.

10. The flash memory according to claim 5, wherein the source region comprises a heavily N-type doped region.

11. The flash memory according to claim 10, wherein the source region comprises an arsenic doped region.

* * * * *